(12) United States Patent
Chen

(10) Patent No.: US 10,325,889 B1
(45) Date of Patent: Jun. 18, 2019

(54) DISPLAY DEVICE INCLUDING LED DEVICES WITH SELECTIVE ACTIVATION FUNCTION

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/869,094

(22) Filed: Jan. 12, 2018

(51) Int. Cl.
  *H01L 25/075* (2006.01)
  *H01L 33/54* (2010.01)
  *H01L 33/62* (2010.01)
  *H01L 33/42* (2010.01)

(52) U.S. Cl.
  CPC .......... *H01L 25/0753* (2013.01); *H01L 33/42* (2013.01); *H01L 33/54* (2013.01); *H01L 33/62* (2013.01)

(58) Field of Classification Search
  CPC ...... H01L 25/0753; H01L 33/42; H01L 33/54
  See application file for complete search history.

(56) References Cited

U.S. PATENT DOCUMENTS

| 5,952,085 | A | 9/1999 | Rickerby et al. |
| 6,770,502 | B2 * | 8/2004 | Cok ............... H01L 27/3211 438/40 |
| 8,333,860 | B1 | 12/2012 | Bibl et al. |
| 8,349,116 | B1 | 1/2013 | Bibl et al. |
| 8,525,210 | B2 | 9/2013 | Tanaka et al. |
| 8,753,910 | B2 | 6/2014 | Cho et al. |
| 9,105,813 | B1 | 8/2015 | Chang |

(Continued)

FOREIGN PATENT DOCUMENTS

| CN | 1346154 A | 4/2002 |
| CN | 102074635 A | 5/2011 |
| JP | H08340132 A | 12/1996 |

OTHER PUBLICATIONS

S. Weise, et al., "Constitutive Behaviour of Lead-Free Solders vs. Lead-containing Solders—Experiments on Bulk Specimens and Flip-Chip Joints", Electronic Components and Technology Conference, 2001 IEEE.

(Continued)

*Primary Examiner* — Errol V Fernandes
(74) *Attorney, Agent, or Firm* — CKC & Partners Co., LLC

(57) ABSTRACT

A display device includes a substrate, at least one bonding electrode, at least one LED device electrically connected to the bonding electrode, and a transparent conductive layer. The bonding electrode is between the LED device and the substrate. The LED device includes a n type semiconductor layer, a p type semiconductor layer between the n type semiconductor layer and the bonding electrode, and an intermediate layer. The p type semiconductor layer includes a high resistance portion and a low resistance portion enclosed by the high resistance portion. A resistivity of the p type semiconductor layer increases from the low resistance portion toward the high resistance portion. The intermediate layer is between the p type semiconductor layer and the bonding electrode. The transparent conductive layer is electrically connected to the n type semiconductor layer. The LED device is between the transparent conductive layer and the bonding electrode.

19 Claims, 18 Drawing Sheets

(56) References Cited

U.S. PATENT DOCUMENTS

| | | |
|---|---|---|
| 9,184,342 B1 | 11/2015 | Chang |
| 9,385,267 B2 | 7/2016 | Chen et al. |
| 9,484,492 B2 | 11/2016 | Bour et al. |
| 9,590,137 B2 | 3/2017 | Chen et al. |
| 2001/0050531 A1 | 12/2001 | Ikeda |
| 2003/0189212 A1 | 10/2003 | Yoo |
| 2004/0245537 A1 | 12/2004 | Kawakami et al. |
| 2006/0128065 A1 | 6/2006 | Inada et al. |
| 2007/0278420 A1 | 12/2007 | Molhave |
| 2008/0185606 A1 | 8/2008 | Sano et al. |
| 2009/0034569 A1 | 2/2009 | Tanabe |
| 2009/0086781 A1 | 4/2009 | Tanabe |
| 2011/0136271 A1 | 6/2011 | von Malm |
| 2012/0097983 A1 | 4/2012 | Smith et al. |
| 2012/0205705 A1 | 8/2012 | Tanaka et al. |
| 2013/0026499 A1 | 1/2013 | Odnoblyudov |
| 2013/0175564 A1 | 7/2013 | Gehrke et al. |
| 2013/0272330 A1 | 10/2013 | Joseph et al. |
| 2014/0084240 A1 | 3/2014 | Hu et al. |
| 2015/0008389 A1 | 1/2015 | Hu et al. |
| 2015/0084054 A1* | 3/2015 | Fan .................. G02F 1/00 257/72 |
| 2015/0263234 A1 | 9/2015 | Cho et al. |
| 2015/0270442 A1 | 9/2015 | Chae et al. |
| 2016/0064594 A1 | 3/2016 | Chen et al. |
| 2016/0072012 A1 | 3/2016 | Chen et al. |
| 2017/0263808 A1* | 9/2017 | Hyun .................. H01L 33/0062 |

OTHER PUBLICATIONS

WaferBOND HT-10. 10 Data Sheet, published at https://www.brewerscience.com/wp-content/uploads/2016/05/WafterBOND-HT-1010-Data-Sheet.pdf, Jan. 9, 2017.

* cited by examiner

DISPLAY DEVICE INCLUDING LED DEVICES WITH SELECTIVE ACTIVATION FUNCTION

BACKGROUND

Field of Invention

The present disclosure relates to a display device, and more particularly, to a display device including light emitting diodes.

Description of Related Art

In the recent years, light-emitting diodes (LEDs) have become popular in general and commercial lighting applications. As light sources, LEDs have many advantages including low energy consumption, long lifetime, small size, and fast switching, and hence conventional lighting, such as incandescent lighting, is gradually replaced by LED lights.

SUMMARY

According to some embodiments of the present disclosure, a display device includes a substrate, at least one bonding electrode, at least one light emitting diode (LED) device, and a transparent conductive layer. The LED device is electrically connected to the bonding electrode. The bonding electrode is between the LED device and the substrate. The LED device includes a p type semiconductor layer, a n type semiconductor layer, and an intermediate layer. The p type semiconductor layer includes a low resistance portion and a high resistance portion. The low resistance portion is enclosed by the high resistance portion. A resistivity of the p type semiconductor layer increases from the low resistance portion toward the high resistance portion. The p type semiconductor layer is between the n type semiconductor layer and the bonding electrode. The intermediate layer is between the p type semiconductor layer and the bonding electrode. The transparent conductive layer is electrically connected to the n type semiconductor layer. The LED device is between the transparent conductive layer and the bonding electrode.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
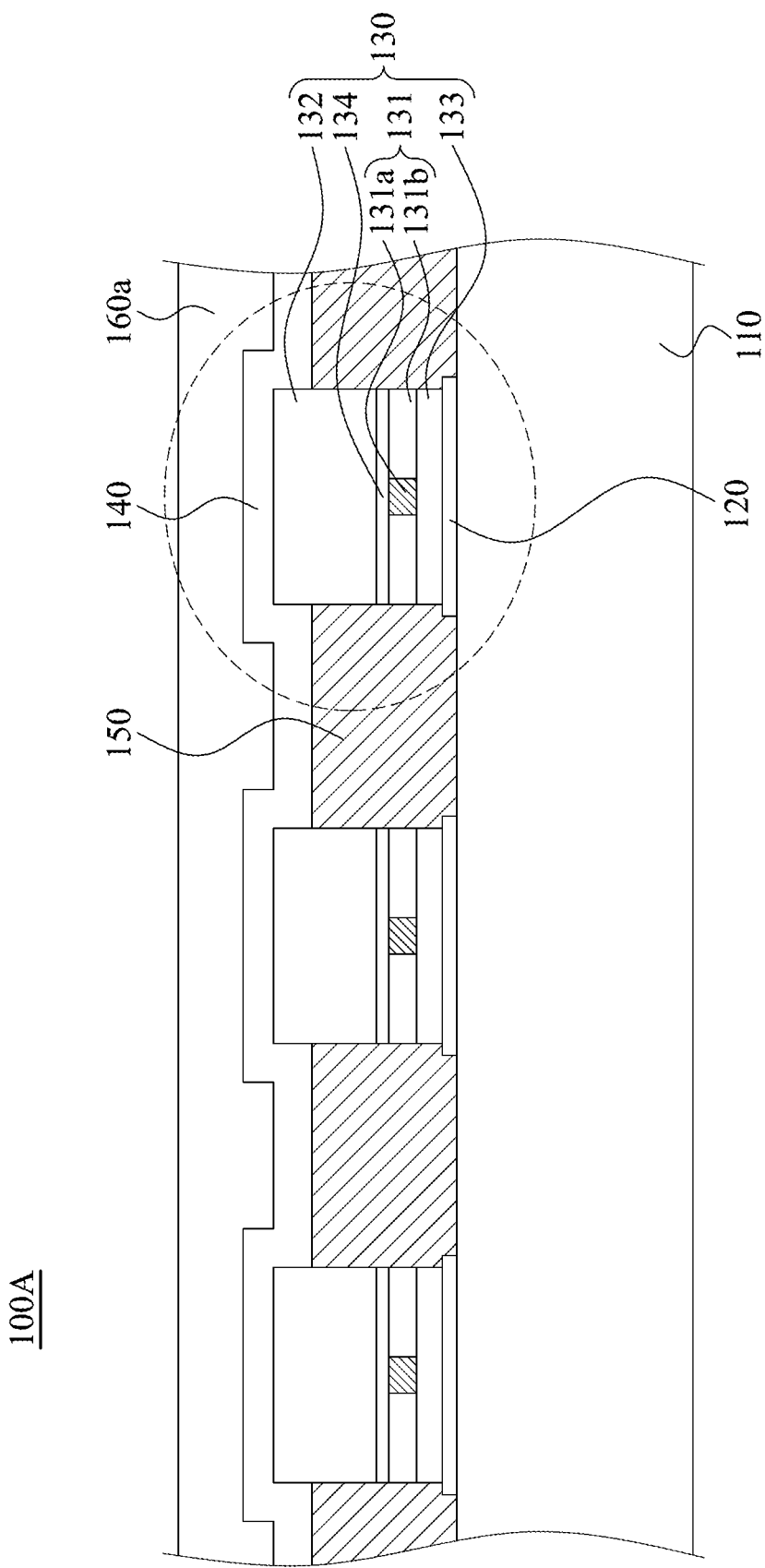
FIG. 1 is a schematic cross-sectional view of a display device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2A:
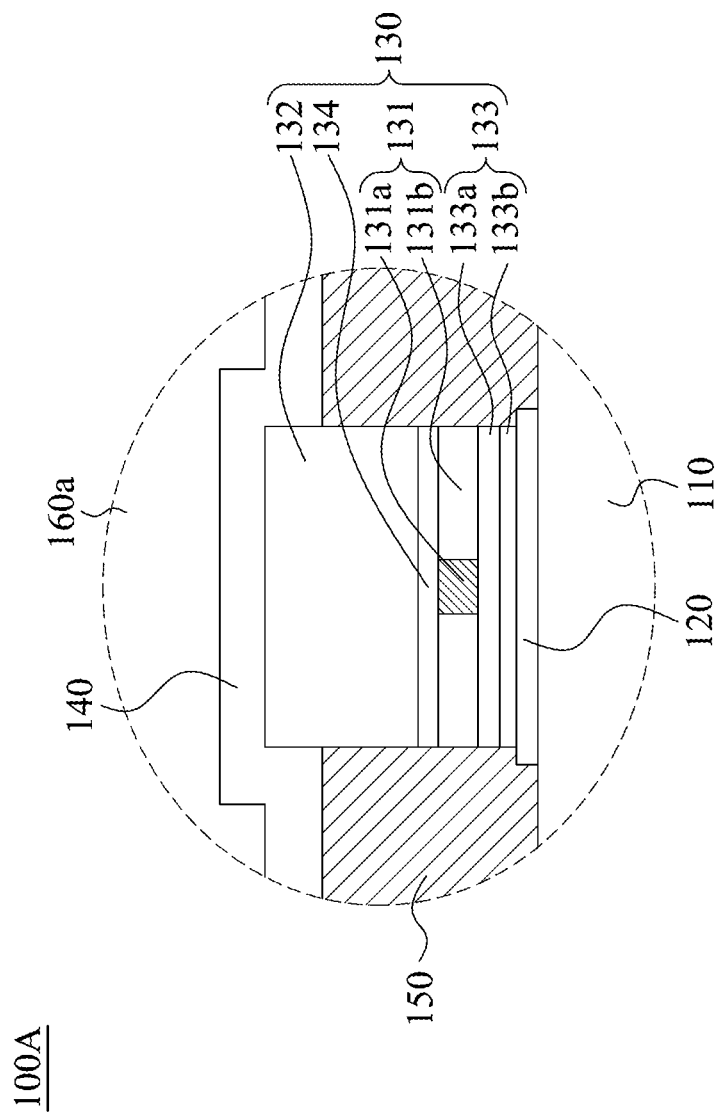
FIG. 2A is an enlarged cross-sectional view of the display device shown in FIG. 1 according to some embodiments of the present disclosure.

Reference is made to FIGS. 1 and 2A. FIG. 1 is a schematic cross-sectional view of a display device 100A according to some embodiments of the present disclosure. FIG. 2A is an enlarged cross-sectional view of the display device 100A shown in FIG. 1 according to some embodiments of the present disclosure. In some embodiments as illustrated in FIG. 1, the display device 100A includes a substrate 110, a plurality of bonding electrodes 120, a plurality of light emitting diode (LED) devices 130, and a transparent conductive layer 140. As illustrated in FIG. 2A, the LED device 130 is electrically connected to the bonding electrode 120. The bonding electrode 120 is between the LED device 130 and the substrate 110. The LED device 130 includes a p type semiconductor layer 131, a n type semiconductor layer 132, an intermediate layer 133, and an active layer 134. The p type semiconductor layer 131 includes a low resistance portion 131a and a high resistance portion 131b. The low resistance portion 131a is enclosed by the high resistance portion 131b. A resistivity of the p type semiconductor layer 131 increases from the low resistance portion 131a toward the high resistance portion 131b. The p type semiconductor layer 131 is between the n type semiconductor layer 132 and the bonding electrode 120. The intermediate layer 133 is between the p type semiconductor layer 131 and the bonding electrode 120. The transparent conductive layer 140 is electrically connected to the n type semiconductor layer 132. The LED device 130 is between the transparent conductive layer 140 and the bonding electrode 120. In some embodiments, the transparent conductive layer 140 may include, for example, indium tin oxide (ITO).

In some embodiments as illustrated in FIG. 2A, the intermediate layer 133 includes an ohmic contact layer 133a electrically connected with the p type semiconductor layer 131. In some embodiments, the intermediate layer 133 is a metal layer, and the ohmic contact layer 133a may be achieved by eutectic alloy bonding of the intermediate layer 133 and the p type semiconductor layer 131. In some embodiments, the ohmic contact layer 133a may include, for example, at least one of Ti, Ni, Au, Cr, and W.

In some embodiments, the intermediate layer 133 includes a reflective layer (not shown). In some embodiments, the ohmic contact layer 133a has a high reflectivity and thus serves as a reflective layer.

In some embodiments as illustrated in FIG. 2A, the intermediate layer 133 further includes a bonding layer 133b. In some embodiments, the bonding layer 133b may be omitted, and the ohmic contact layer 133a serves as a layer configured to bond the LED device 130 and the bonding electrode 120. In some embodiments, the bonding layer 133b may include, for example, Sn, Sn—Pb, Sn—Pb—Bi, In—Ag, In, Au—In, Sn—Ag.

In some embodiments, the bonding electrode 120 may include, for example, Cu, Ti—Cu, or Mo—Al—Mo. In some other embodiments, the bonding electrode 120 may include a Cu layer bonded with the intermediate layer 133 and a Ti layer bonded with the substrate 110.

In some embodiments as illustrated in FIGS. 1 and 2A, the display device 100A further includes an isolation layer 150. The isolation layer 150 is around the bonding electrode 120 and the LED device 130. At least a portion of the n type semiconductor layer 132 is exposed from the isolation layer 150 and is electrically coupled with the transparent conductive layer 140.

In some embodiments as illustrated in FIG. 2A, a top surface of the isolation layer 150 is lower than a top surface of the n type semiconductor layer 132.

In some embodiments as illustrated in FIGS. 1 and 2A, the display device 100A further includes a first insulating layer 160a. The transparent conductive layer 140 is between the first insulating layer 160a and the substrate 110. The LED device 130 has a first refractive index. The first insulating layer 160a has a second refractive index. The first refractive index is greater than the second refractive index.

Figure 2B:
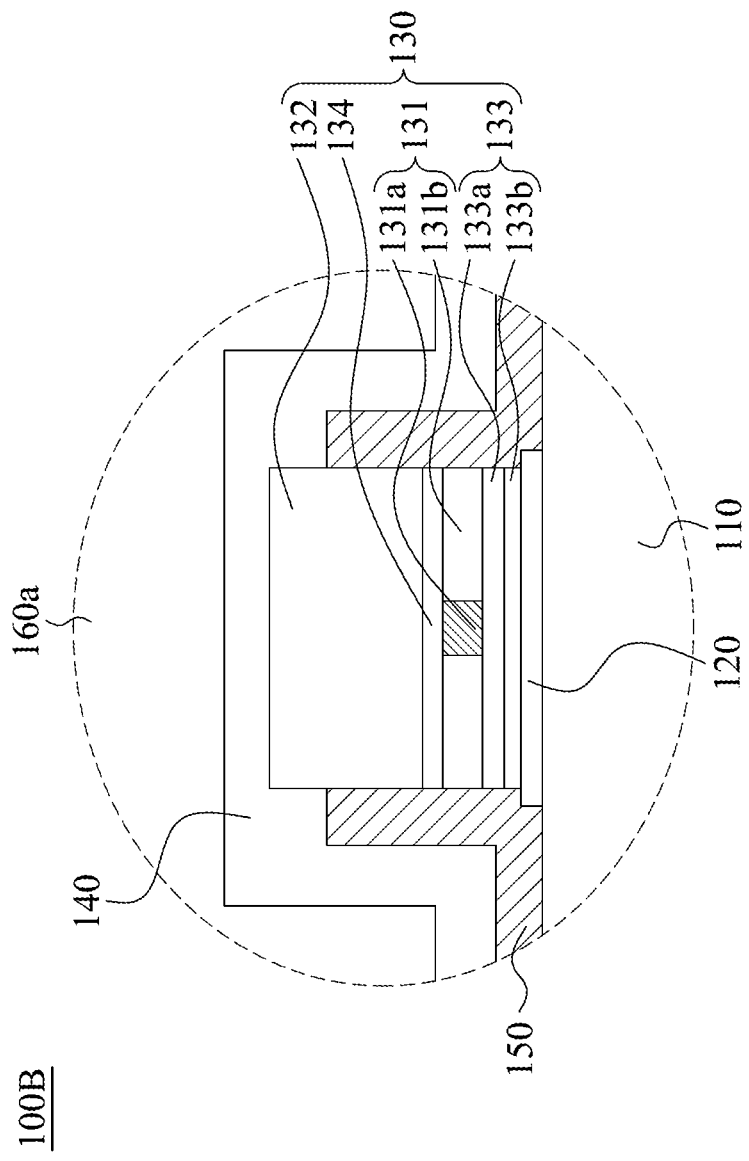
FIG. 2B is an enlarged cross-sectional view of a display device according to some embodiments of the present disclosure.

Reference is made to FIG. 2B. FIG. 2B is an enlarged cross-sectional view of a display device 100B according to some embodiments of the present disclosure. It should be pointed out that a difference between the display device 100B illustrated in FIG. 2B and the display device 100A illustrated in FIG. 2A is that, the top surface of the isolation layer 150 illustrated in FIG. 2A is substantially leveled at a height relative to the substrate 110, while the top surface of the isolation layer 150 illustrated in FIG. 2B has different portions respectively leveled at different heights relative to the substrate 110. Specifically, the portion of the top surface of the isolation layer 150 illustrated in FIG. 2B in contact with the n type semiconductor layer 132 is lower than the top surface of the n type semiconductor layer 132. In the display device 100B illustrated in FIG. 2B, details which are similar to the display device 100A illustrated in FIG. 2A are not repeated to avoid duplicity.

Figure 2C:
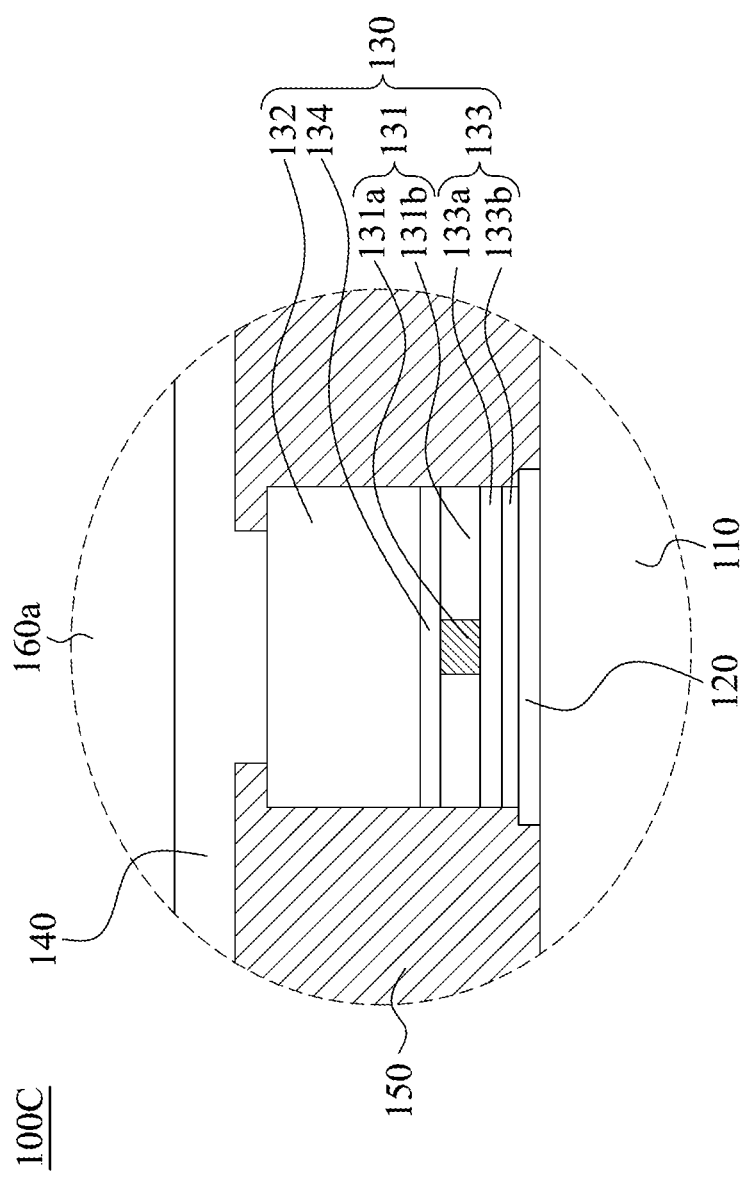
FIG. 2C is an enlarged cross-sectional view of a display device according to some embodiments of the present disclosure.

Reference is made to FIG. 2C. FIG. 2C is an enlarged cross-sectional view of a display device 100C according to some embodiments of the present disclosure. It should be pointed out that a difference between the display device 100C illustrated in FIG. 2C and the display device 100A illustrated in FIG. 2A is that, the top surface of the isolation layer 150 is higher than the top surface of the n type semiconductor layer 132. In the display device 100C illustrated in FIG. 2C, details which are similar to the display device 100A illustrated in FIG. 2A are not repeated to avoid duplicity.

Figure 2D:
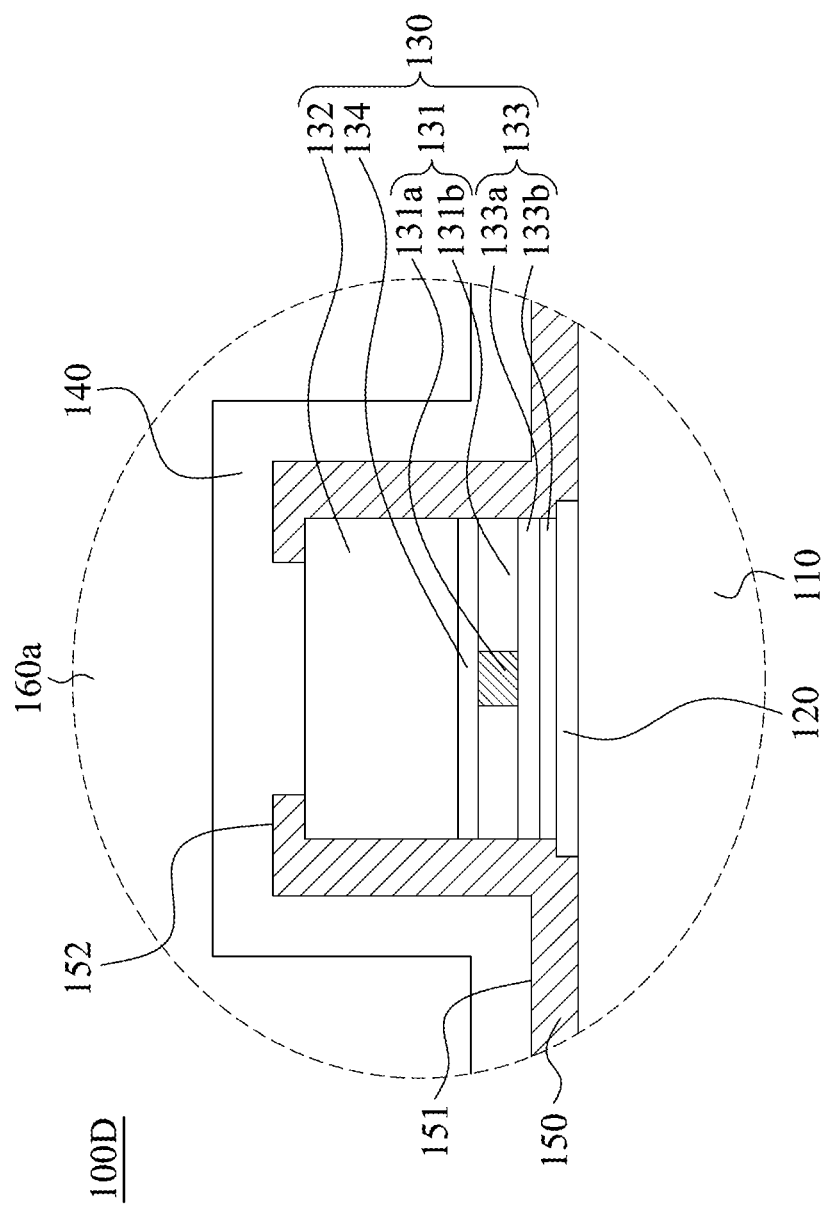
FIG. 2D is an enlarged cross-sectional view of a display device according to some embodiments of the present disclosure.

Reference is made to FIG. 2D. FIG. 2D is an enlarged cross-sectional view of a display device 100D according to some embodiments of the present disclosure. It should be pointed out that a difference between the display device 100D illustrated in FIG. 2D and the display device 100A illustrated in FIG. 2A is that, the top surface of the isolation layer 150 includes a first portion 151 and a second portion 152. The first portion 151 of a top surface of the isolation layer 150 is lower than the top surface of the n type semiconductor layer 132. The second portion 152 of the top surface of the isolation layer 150 is higher than the top surface of the n type semiconductor layer 132. In some embodiments as illustrated in FIG. 2D, a vertical projection of the second portion 152 of the top surface of the isolation layer 150 projected on the n type semiconductor layer 132 overlaps with the top surface of the n type semiconductor layer 132. In the display device 100D illustrated in FIG. 2D, details which are similar to the display device 100A illustrated in FIG. 2A are not repeated to avoid duplicity.

Figure 3A:
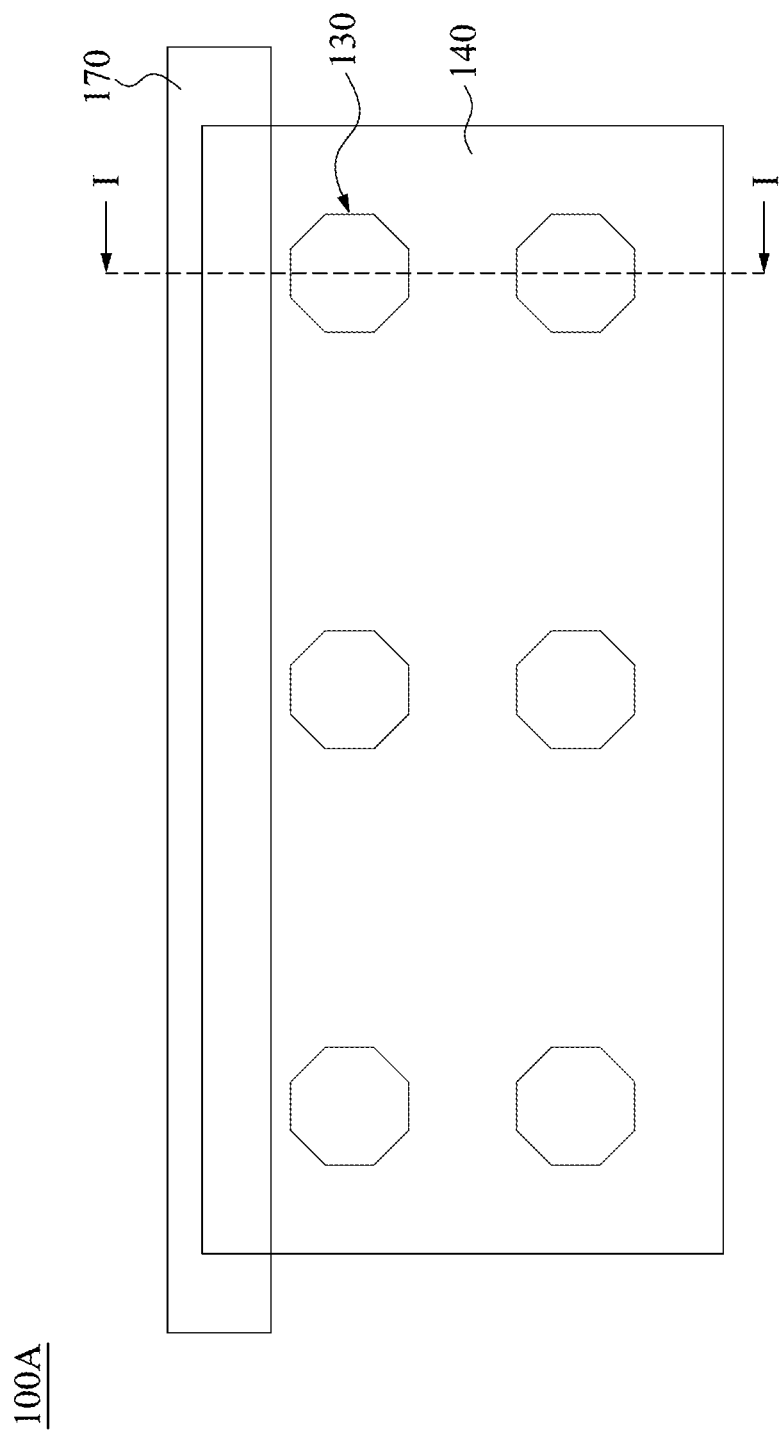
FIG. 3A is a schematic top view of a display device according to some embodiments of the present disclosure.
Figure 3B:
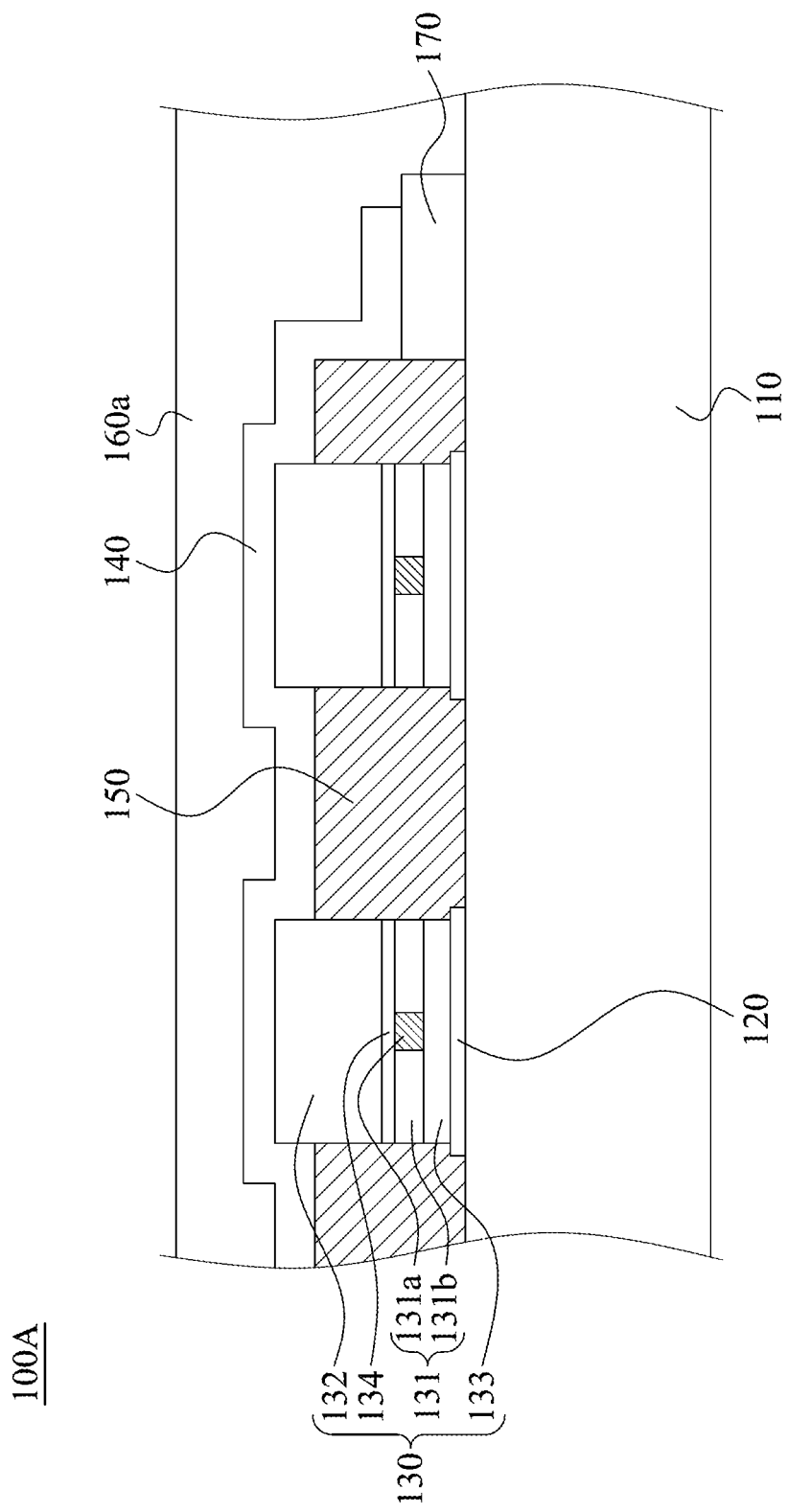
FIG. 3B is a schematic cross-sectional view of the display device in FIG. 3A taken along line I-I according to some embodiments of the present disclosure.

Reference is made to FIGS. 3A and 3B. FIG. 3A is a schematic top view of the display device 100A shown in FIG. 1 according to some embodiments of the present disclosure. FIG. 3B is a schematic cross-sectional view of the display device 100A in FIG. 3A taken along line I-I according to some embodiments of the present disclosure. In some embodiments as illustrated in FIGS. 3A and 3B, the display device 100A further includes at least one cathode bus 170. The n type semiconductor layer 132 is electrically connected with the cathode bus 170 by the transparent conductive layer 140. The cathode bus 170 has at least a portion between the transparent conductive layer 140 and the substrate 110. Specifically, the display device 100A includes a plurality of the LED devices 130, and the transparent conductive layer 140 entirely covers the top surfaces of the LED devices 130.

In addition, in some embodiments as illustrated in FIGS. 3A and 3B, the LED devices 130 at least form a 2 by 2 matrix on the substrate 110. A size of each of the LED devices 130 is less than about 200 micrometer. An area of each of the LED devices 130 is less than about 40000 square micrometers.

Figure 4A:
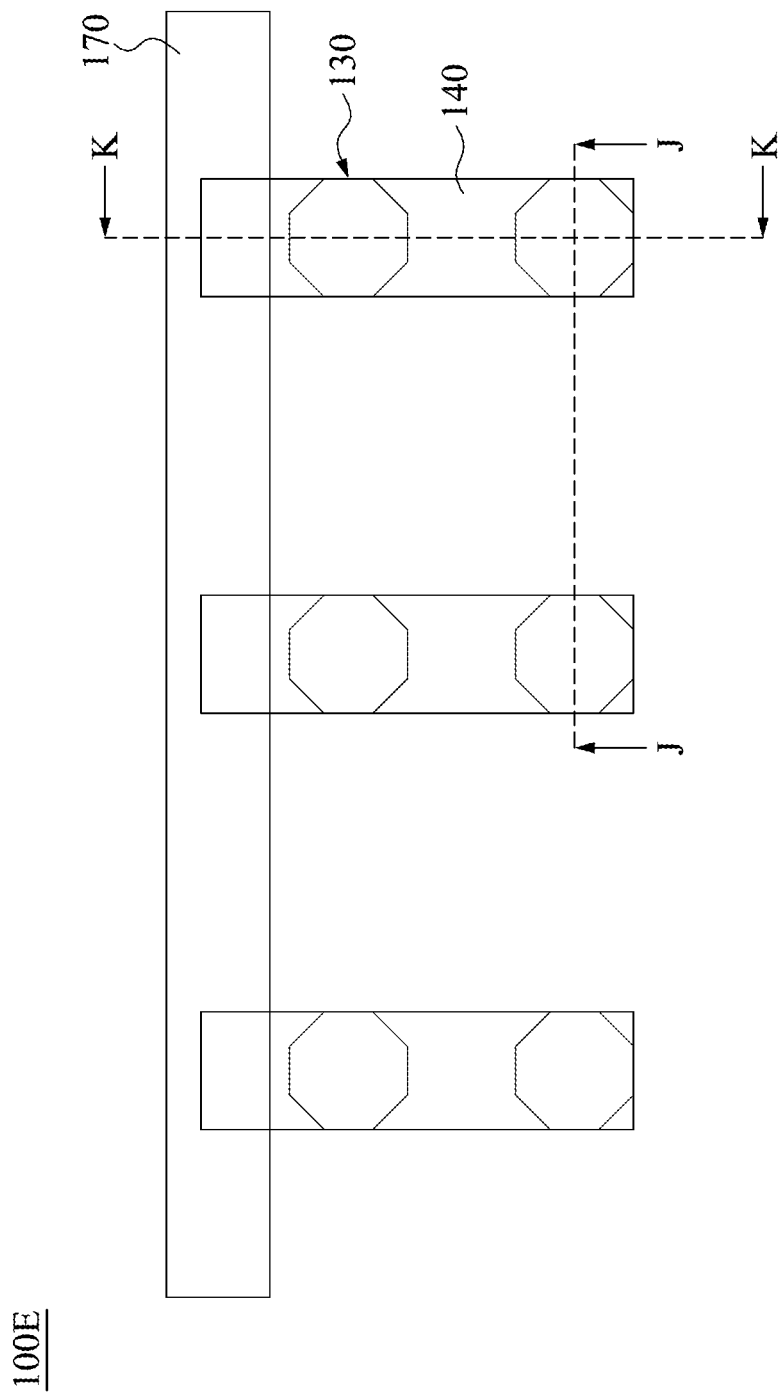
FIG. 4A is a schematic top view of a display device according to some embodiments of the present disclosure.
Figure 4B:
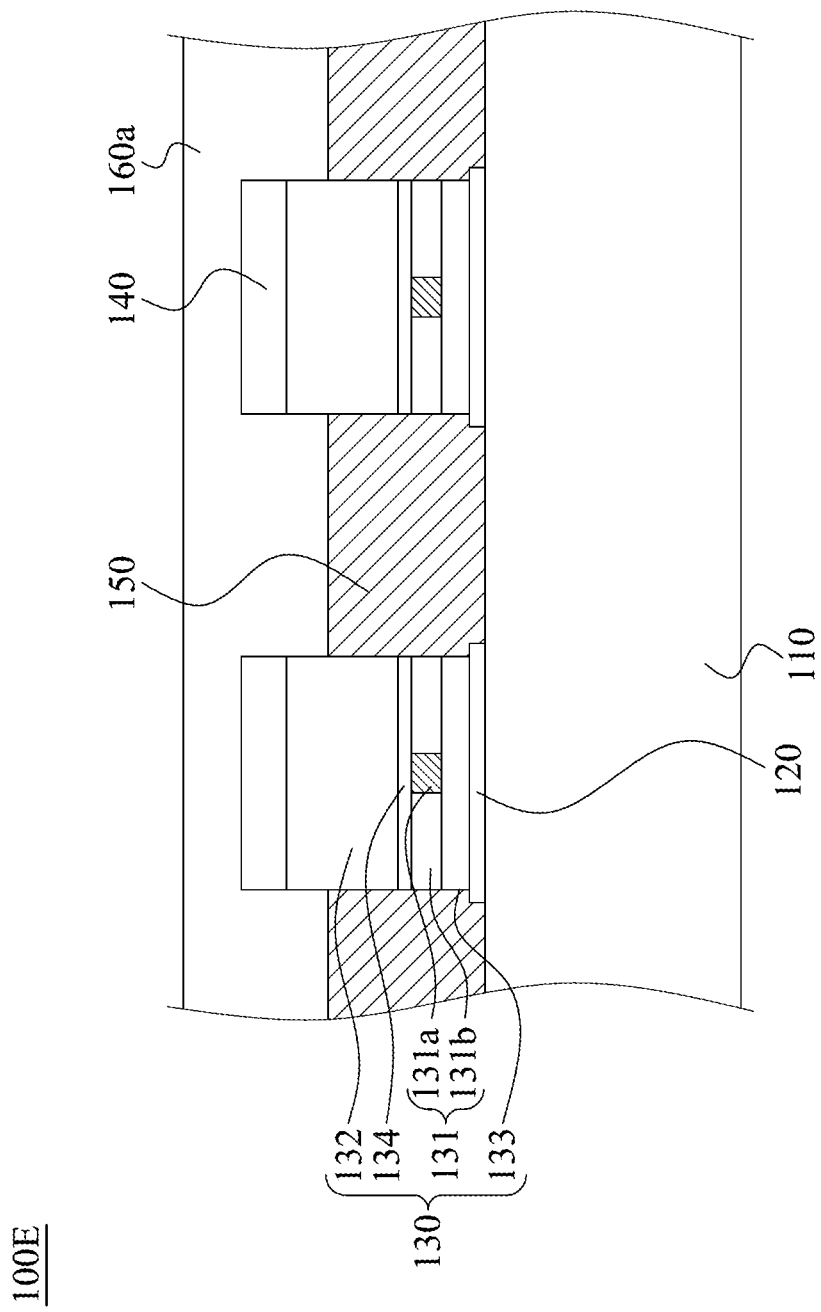
FIG. 4B is a schematic cross-sectional view of the display device in FIG. 4A taken along line J-J according to some embodiments of the present disclosure.
Figure 4C:
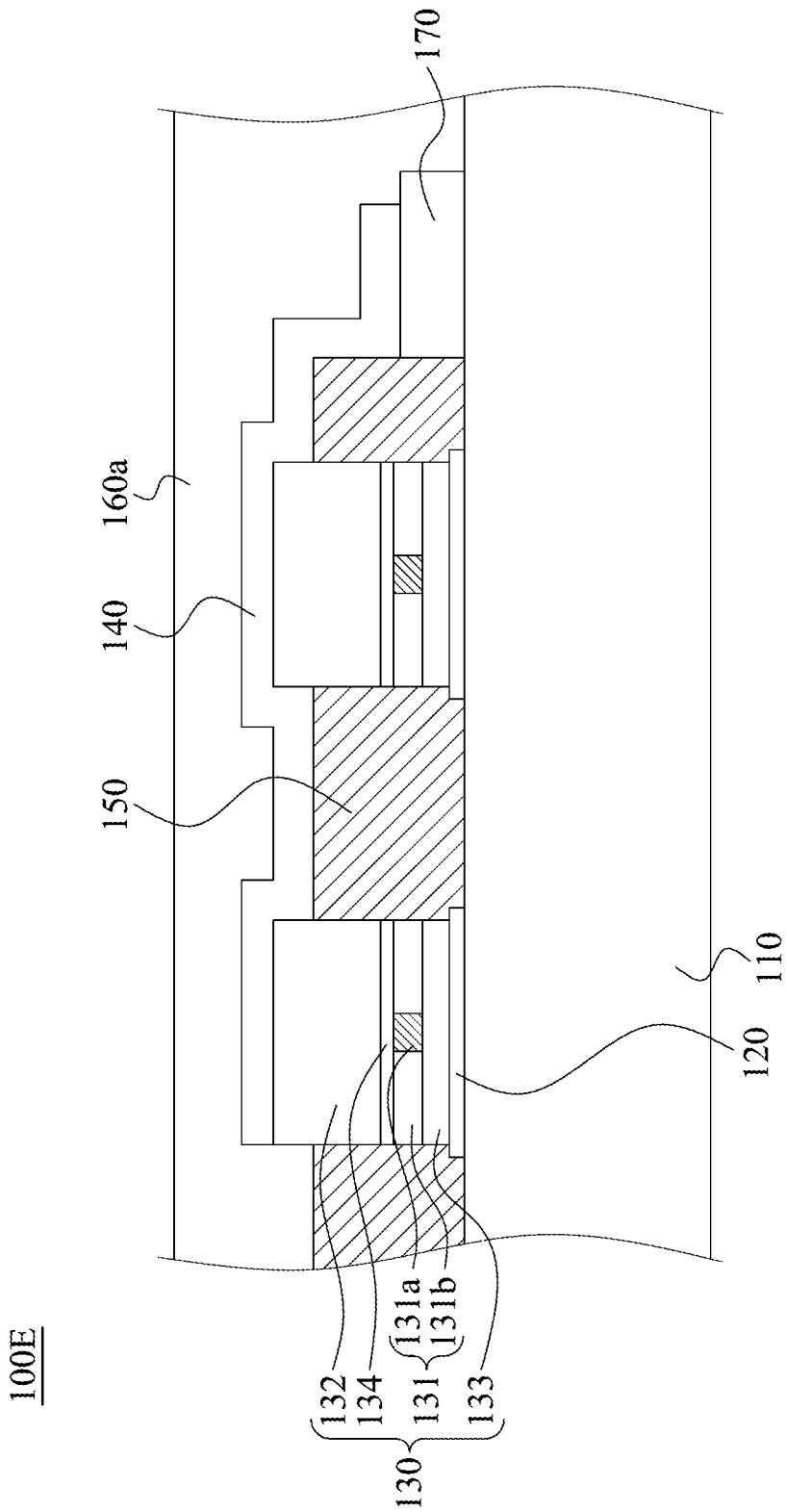
FIG. 4C is a schematic cross-sectional view of the display device in FIG. 4A taken along line K-K according to some embodiments of the present disclosure.

Reference is made to FIGS. 4A-4C. FIG. 4A is a schematic top view of a display device 100E according to some embodiments of the present disclosure. FIG. 4B is a schematic cross-sectional view of the display device 100E in FIG. 4A taken along line J-J according to some embodiments of the present disclosure. FIG. 4C is a schematic cross-sectional view of the display device 100E in FIG. 4A taken along line K-K according to some embodiments of the present disclosure. It should be pointed out that a difference between the display device 100E illustrated in FIGS. 4A-4C and the display device 100A illustrated in FIGS. 3A and 3B is that, the display device 100E illustrated in FIGS. 4A-4C includes a plurality of the separated transparent conductive layers 140. Specifically, each of the LED devices 130 is electrically connected to the cathode bus 170 via a corresponding one of the separated transparent conductive layers 140. In some embodiments as illustrated in FIGS. 4A-4C, at least one edge of at least one of the LED devices 130 is vertically aligned with an edge of a corresponding one of the separated transparent conductive layers 140 connected thereto. In some embodiments, no edge of at least one of the LED devices 130 is vertically aligned with any edge of a corresponding one of the separated transparent conductive layers 140 connected thereto. In practical applications, the separated transparent conductive layers 140 are fabricated by a patterning process.

Figure 5:
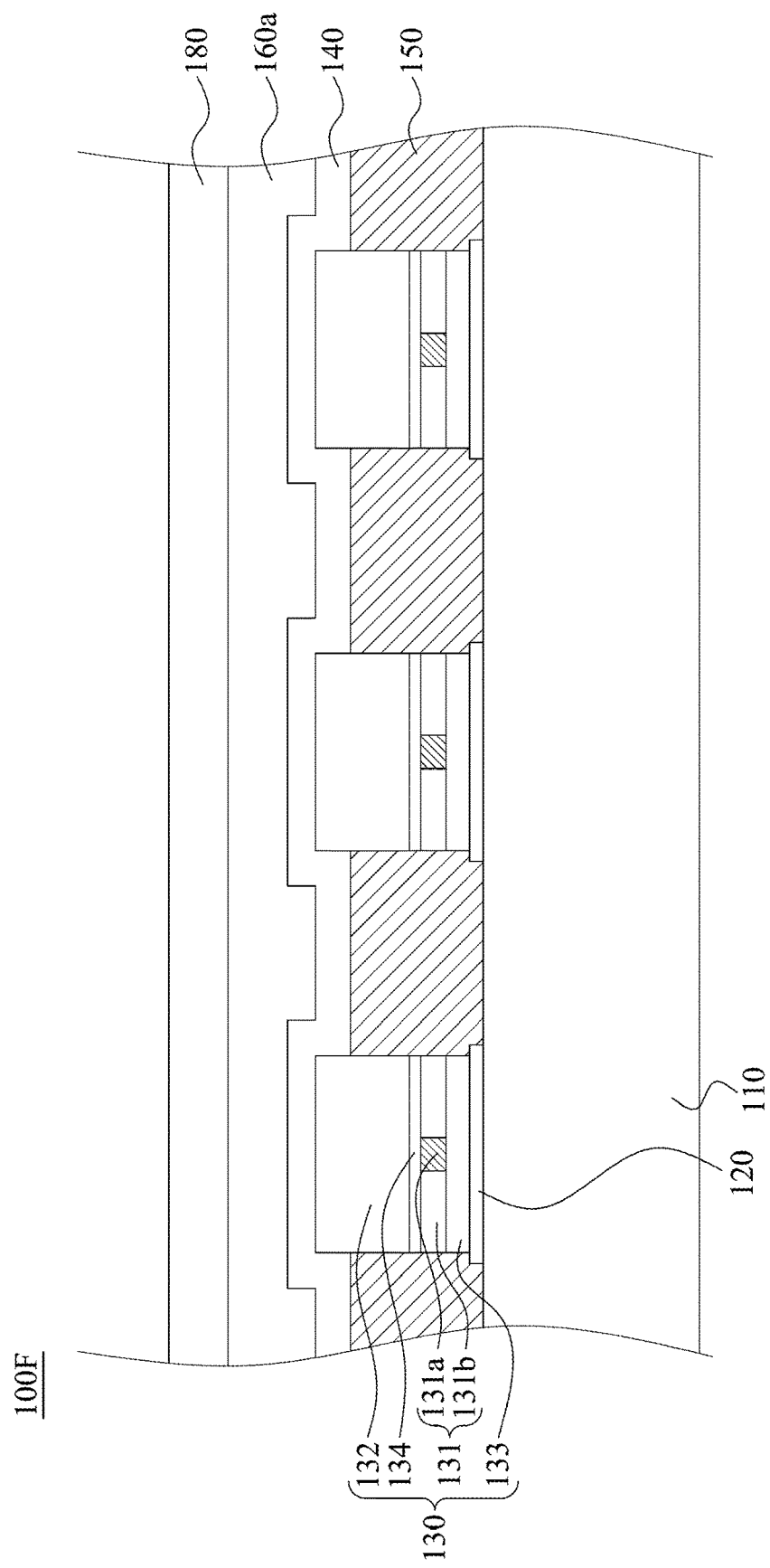
FIG. 5 is a schematic cross-sectional view of a display device according to some embodiments of the present disclosure.

Reference is made to FIG. 5. FIG. 5 is a schematic cross-sectional view of a display device 100F according to some embodiments of the present disclosure. It should be pointed out that a difference between the display device 100F illustrated in FIG. 5 and the display device 100A illustrated in FIG. 2A is that, the display device 100F further includes an encapsulation layer 180. The first insulating layer 160a is between the encapsulation layer 180 and the substrate 110. In the display device 100F illustrated in FIG. 5, details which are similar to the display device 100A illustrated in FIG. 2A are not repeated to avoid duplicity.

Figure 6:
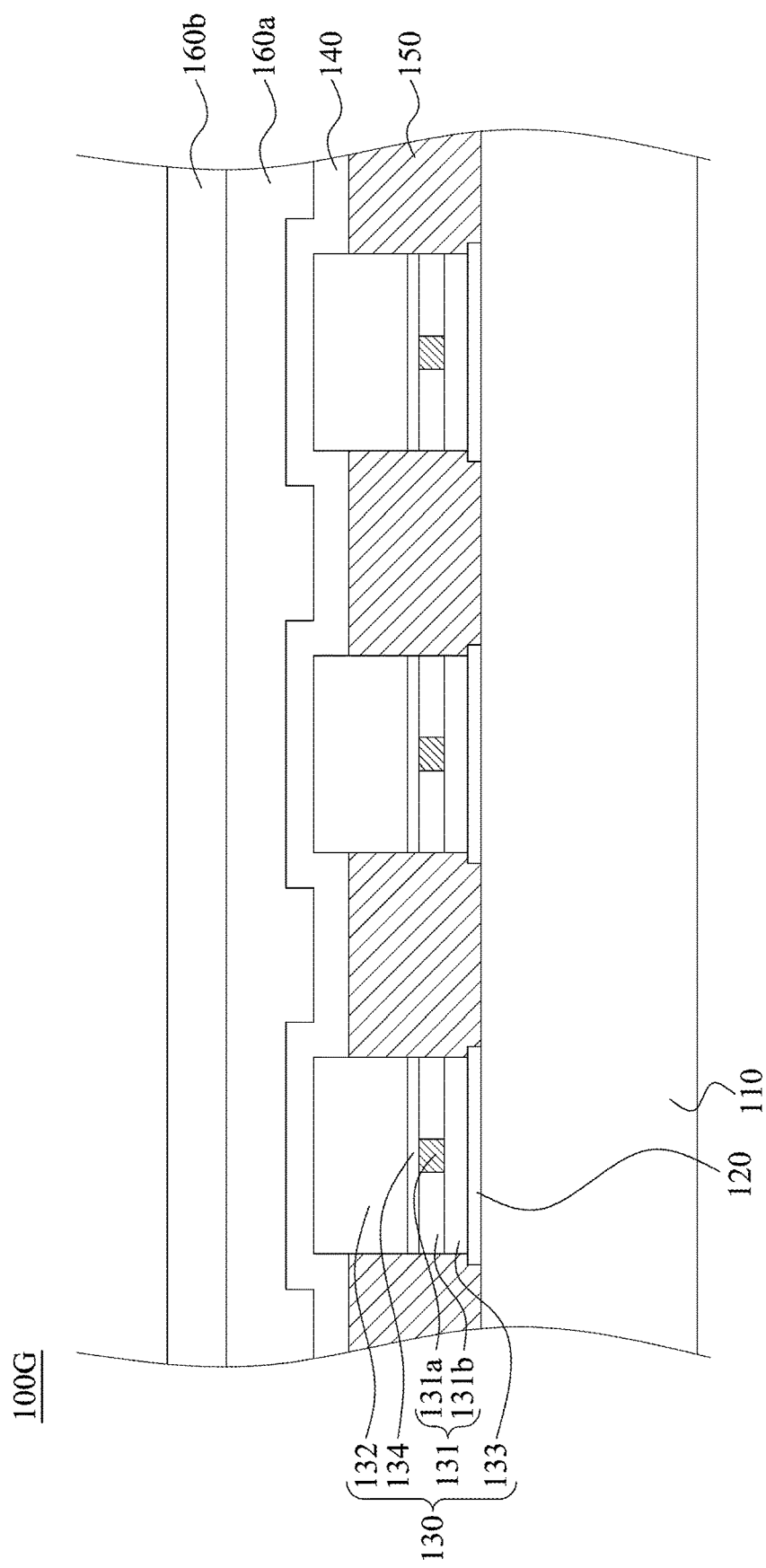
FIG. 6 is a schematic cross-sectional view of a display device according to some embodiments of the present disclosure.

Reference is made to FIG. 6. FIG. 6 is a schematic cross-sectional view of a display device 100G according to some embodiments of the present disclosure. It should be pointed out that a difference between the display device 100G illustrated in FIG. 6 and the display device 100A illustrated in FIG. 2A is that, the display device 100G further includes a second insulating layer 160b. At least a portion of the first insulating layer 160a is between the second insulating layer 160b and the substrate 110. The second insulating layer 160b has a third refractive index, and the second refractive index of the first insulating layer 160a is greater than the third refractive index. In the display device 100G illustrated in FIG. 6, details which are similar to the display device 100A illustrated in FIG. 2A are not repeated to avoid duplicity.

Figure 7:
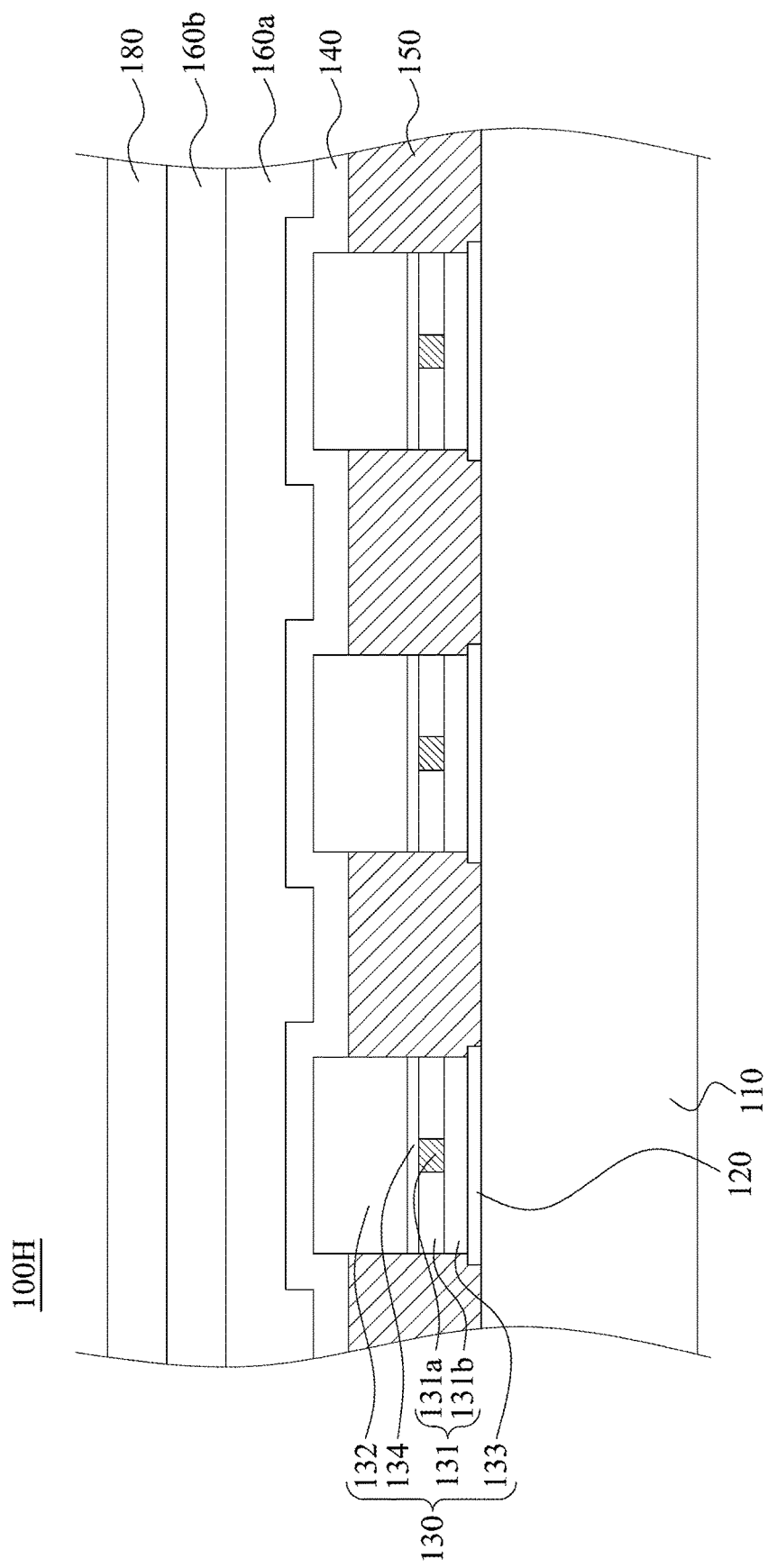
FIG. 7 is a schematic cross-sectional view of a display device according to some embodiments of the present disclosure.

Reference is made to FIG. 7. FIG. 7 is a schematic cross-sectional view of a display device 100H according to some embodiments of the present disclosure. It should be pointed out that a difference between the display device 100H illustrated in FIG. 7 and the display device 100G illustrated in FIG. 6 is that, the display device 100H further includes an encapsulation layer 180. At least a portion of the second insulating layer 160b is between the encapsulation layer 180 and the first insulating layer 160a. In the display device 100H illustrated in FIG. 7, details which are similar to the display device 100G illustrated in FIG. 6 are not repeated to avoid duplicity.

Figure 8:
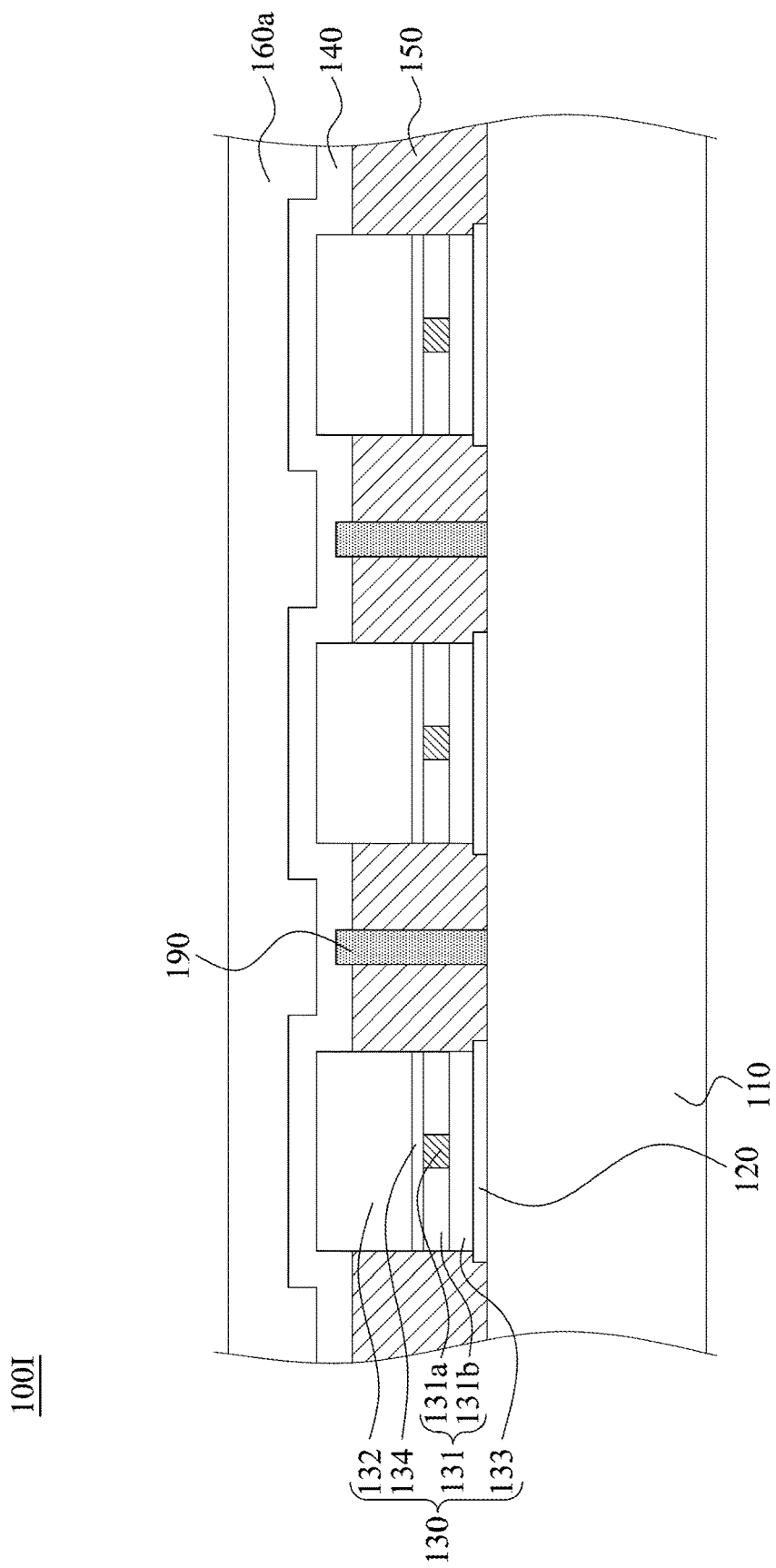
FIG. 8 is a schematic cross-sectional view of a display device according to some embodiments of the present disclosure.

Reference is made to FIG. 8. FIG. 8 is a schematic cross-sectional view of a display device 100I according to some embodiments of the present disclosure. It should be pointed out that a difference between the display device 100I illustrated in FIG. 8 and the display device 100A illustrated in FIG. 2A is that, the display device 100I further includes an optical isolation structure 190 between adjacent two of the LED devices 130. In the display device 100I illustrated in FIG. 8, details which are similar to the display device 100A illustrated in FIG. 2A are not repeated to avoid duplicity.

Figure 9:
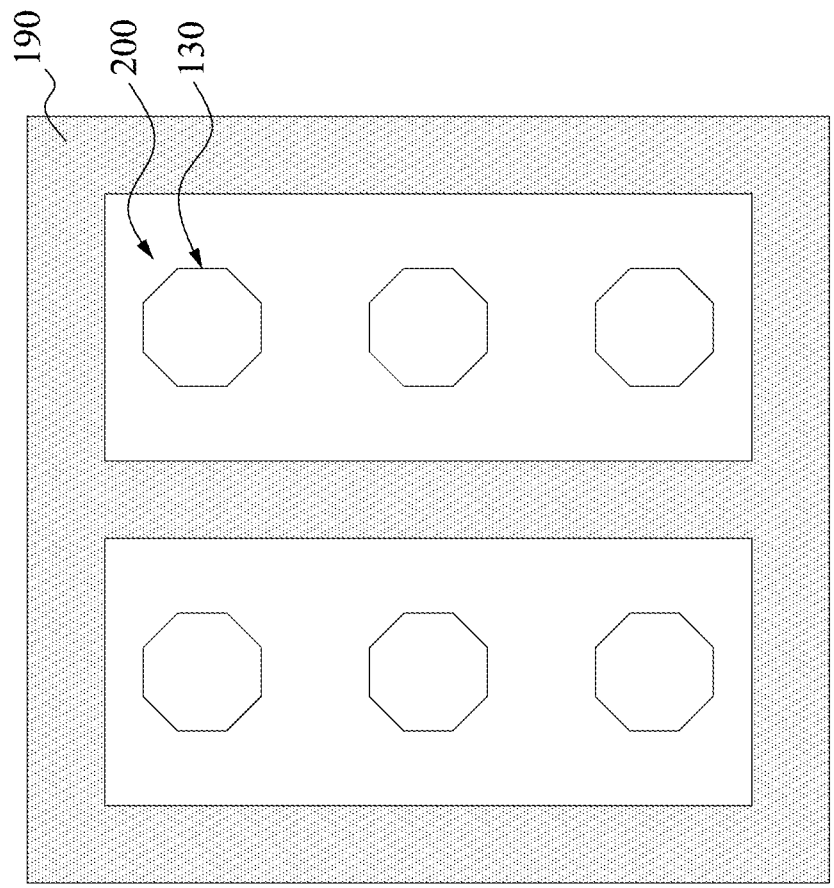
FIG. 9 is a schematic top view of a display device according to some embodiments of the present disclosure.

Reference is made to FIG. 9. FIG. 9 is a schematic top view of a display device 100J according to some embodiments of the present disclosure. In the embodiments as illustrated in FIG. 9, the display device 100J further includes at least two pixels 200 and an optical isolation structure 190. Each of the pixels 200 includes at least two of the LED devices 130. The optical isolation structure 190 is between the two pixels 200. Specifically, each of the pixels 200 is enclosed by the optical isolation structure 190, but the disclosure is not limited in this regard.

Figure 10A:
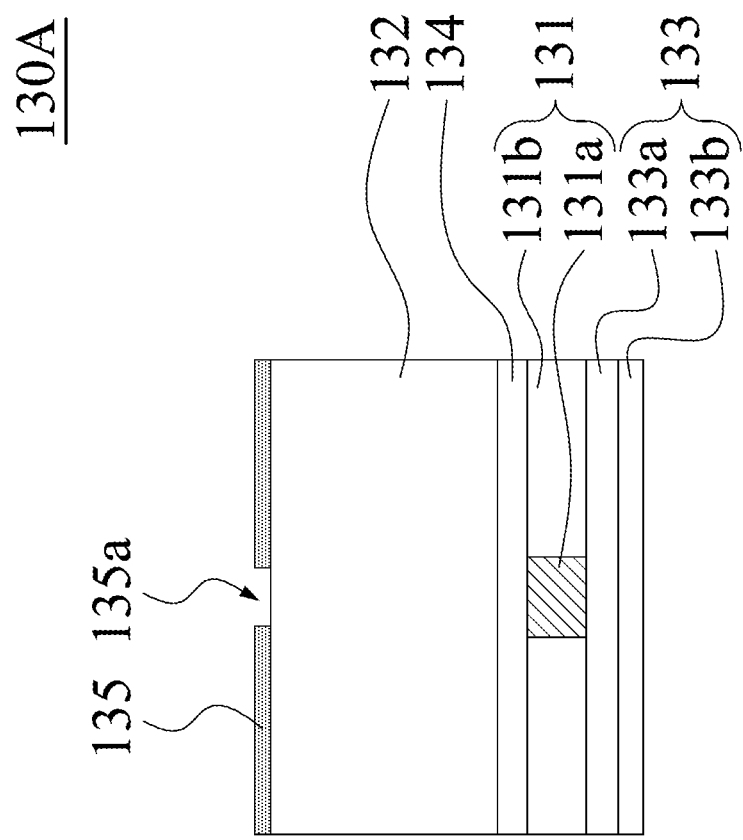
FIG. 10A is a cross-sectional view of an LED device according to an embodiment of the present disclosure.

FIG. 10A is a cross-sectional view of an LED device 130A according to an embodiment of the present disclosure. The difference between the present embodiment and the embodiment shown in FIG. 2A is that the LED device 130A further includes a current control layer 135 joined with the n type semiconductor layer 132. The current control layer 135 has an opening 135a therein, and a vertical projection of the opening 135a of the current control layer 135 on a bottom surface of the p type semiconductor layer 131 at least partially overlaps with the low resistance portion 131a of the p type semiconductor layer 131. In addition, current control layer 135 is joined with a side of the n type semiconductor layer 132 distal to the p type semiconductor layer 131.

In some embodiments, the current control layer 135 is a dielectric layer which is made of a dielectric material, such as silicon nitride or silicon dioxide. In some embodiments, the current control layer 135 is a semiconductor layer, and an ohmic contact consisting of proper metal materials is joined between the current control layer 135 and the transparent conductive layer 140 (as illustrated in FIG. 1), such that the n type semiconductor layer 132 and the current control layer 135 can form a Schottky barrier therebetween. In some embodiments as illustrated in the present embodiment, the current control layer 135 is one of a hole blocking layer and an electron blocking layer. In some embodiments, the p type semiconductor layer 131 and the n type semiconductor layer 132 form a first p-n junction. The current control layer 135 and the n type semiconductor layer 132 form a second p-n junction. A voltage configured to forward bias the first p-n junction will reverses bias the second p-n junction.

Furthermore, while the current control layer 135 illustrated FIG. 10A is joined with the n type semiconductor layer 132, the current control layer 135 can be formed at other locations in the LED structure. In some embodiments, the current control layer 135 can be joined with a side of the p type semiconductor layer 131 distal to the n type semiconductor layer 132. That is, the current control layer 135 can be present between the p type semiconductor layer 131 and the intermediate layer 133, and the intermediate layer 133 is electrically coupled with the p type semiconductor layer 131 through the opening 135a.

Figure 10B:
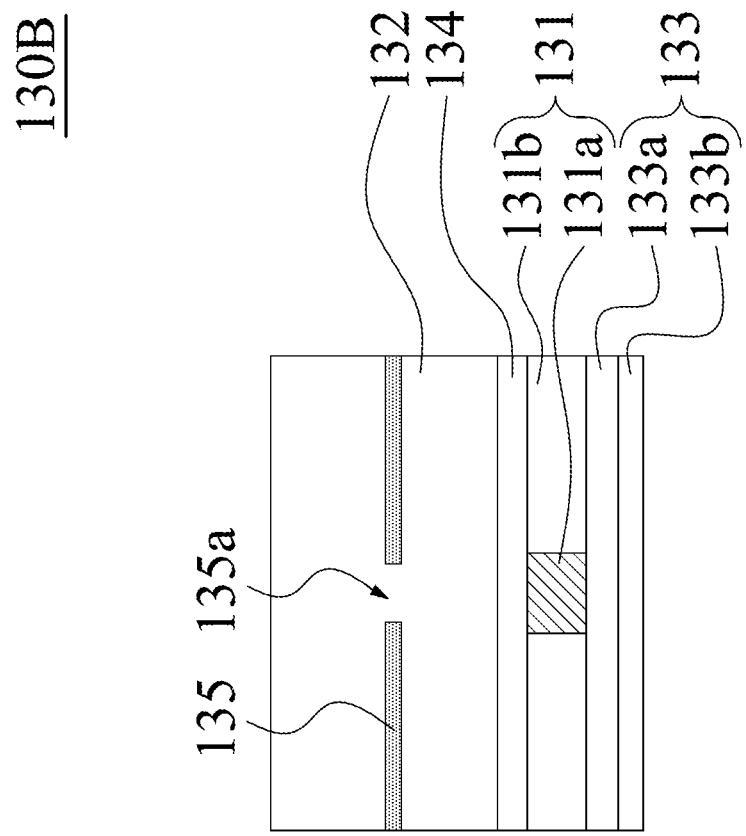
FIG. 10B is a cross-sectional view of an LED device according to another embodiment of the present disclosure.

In some embodiments, the current control layer 135 can be present within one of the p type semiconductor layer 131 and the n type semiconductor layer 132, and the current control layer 135 can be present to be in contact with the active layer 134 or be separated from the active layer 134 by a portion of the semiconductor layer. For example, FIG. 10B is a cross-sectional view of an LED device 130B according to another embodiment of the present disclosure. As shown in FIG. 10B, the current control layer 135 having the opening 135a is present within the n type semiconductor layer 132, in which the current control layer 135 is separated from the active layer 134 by a portion of the n type semiconductor layer 132.

Figure 10C:
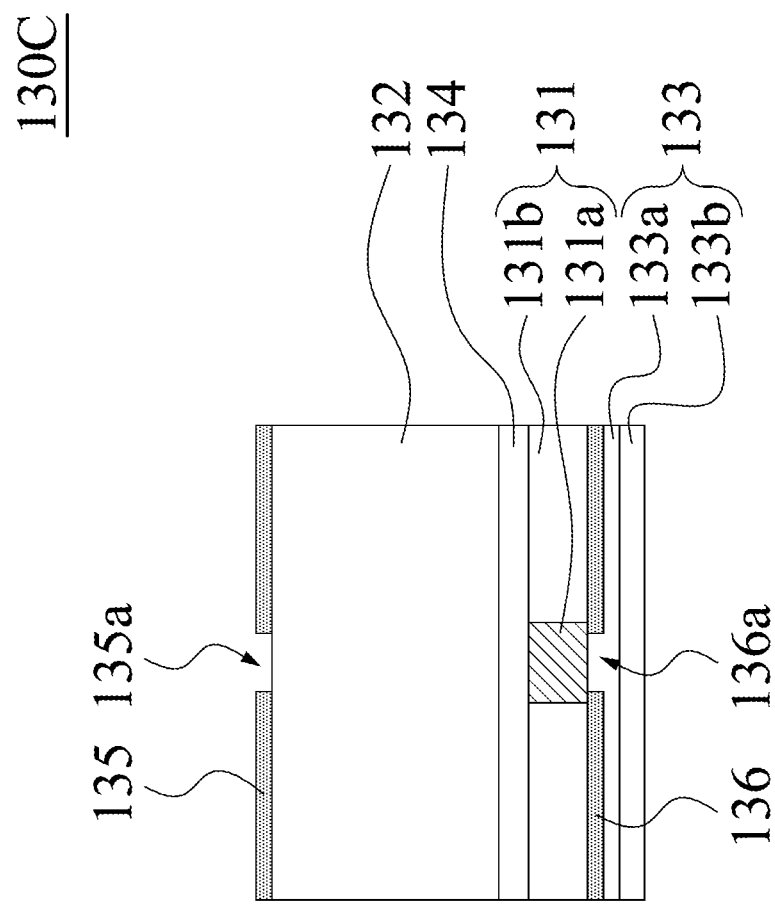
FIG. 10C is a cross-sectional view of an LED device according to another embodiment of the present disclosure.

In some embodiments, a current control layer 136 can be present within the p type semiconductor layer 131 as well. FIG. 10C is a cross-sectional view of an LED device 130C according to another embodiment of the present disclosure, as shown in FIG. 10C, a current control layer 136 having an opening 136a is joined with the p type semiconductor layer 131, in which the current control layer 136 is present between the p type semiconductor layer 131 and the intermediate layer 133, and the intermediate layer 133 is electrically coupled with the p type semiconductor layer 131 through the opening 136a In addition, in some embodiments, more than one current control layer can be present in the LED structure, and the formation of each of the current control layers is independent. For example, the difference between the embodiment shown in FIG. 10C and the embodiment shown in FIG. 10A is that the LED device 130C in FIG. 10C further includes the current control layer 136 joined with the p type semiconductor layer 131, and the current control layer 136 has the opening 136a therein. In some embodiments, vertical projections of the openings 135a and 136a on a bottom surface of the p type semiconductor layer 131 at least partially overlap with the low resistance portion 131a of the p type semiconductor layer 131. Similarly, although the current control layer 136 illustrated in FIG. 10C is joined with the p type semiconductor layer 131, the current control layer 136 can be formed at other locations in the LED structure as well.

In summary, the high resistance portion is configured to confine charge carriers substantially within the low resistance portion. Specifically, since the resistivity of the p type semiconductor layer of the LED device laterally increases from the low resistance portion toward the high resistance portion, when the light emitting diode is biased, charge carriers are apt to flow through the p type semiconductor layer via the low resistance portion, therefore improving the luminous efficiency of the LED device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A display device, comprising:
   a substrate;
   at least one bonding electrode;
   at least one light emitting diode (LED) device electrically connected to the bonding electrode, wherein the bonding electrode is between the LED device and the substrate, and the LED device comprises:
      a p type semiconductor layer having a first surface facing towards the substrate and a second surface opposite to the first surface, the p type semiconductor layer comprising a low resistance portion and a high resistance portion, wherein the low resistance portion is enclosed by the high resistance portion, and a resistivity of the p type semiconductor layer increases from the low resistance portion toward the high resistance portion;
      a n type semiconductor layer, wherein the p type semiconductor layer is between the n type semiconductor layer and the bonding electrode, and the low resistance portion continuously extends from the first surface to the second surface and directly in contact with the first surface and second surface; and
      an intermediate layer between the p type semiconductor layer and the bonding electrode; and
   a transparent conductive layer electrically connected to the n type semiconductor layer, wherein the LED device is between the transparent conductive layer and the bonding electrode.
2. The display device of claim 1, wherein the intermediate layer comprises an ohmic contact layer electrically connected with the p type semiconductor layer.
3. The display device of claim 1, wherein the intermediate layer comprises a reflective layer.
4. The display device of claim 1, wherein the intermediate layer comprises a bonding layer.
5. The display device of claim 1, further comprising:
   an isolation layer around the bonding electrode and the LED device, wherein at least a portion of the n type semiconductor layer is exposed from the isolation layer and is electrically coupled with the transparent conductive layer.
6. The display device of claim 5, wherein a top surface of the isolation layer is lower than a top surface of the n type semiconductor layer.
7. The display device of claim 5, wherein a top surface of the isolation layer is higher than a top surface of the n type semiconductor layer.
8. The display device of claim 5, wherein a first portion of a top surface of the isolation layer is lower than a top surface of the n type semiconductor layer, and a second portion of the top surface of the isolation layer is higher than the top surface of the n type semiconductor layer.
9. The display device of claim 1, further comprising:
   at least one cathode bus, wherein the n type semiconductor layer is electrically connected with the cathode bus by the transparent conductive layer, and the cathode bus has at least a portion between the transparent conductive layer and the substrate.

10. The display device of claim 1, further comprising:
a first insulating layer, wherein the transparent conductive layer is between the first insulating layer and the substrate, the LED device has a first refractive index, the first insulating layer has a second refractive index, and the first refractive index is greater than the second refractive index.

11. The display device of claim 10, further comprising:
an encapsulation layer, wherein the first insulating layer is between the encapsulation layer and the substrate.

12. The display device of claim 10, further comprising:
a second insulating layer, wherein at least a portion of the first insulating layer is between the second insulating layer and the substrate, the second insulating layer has a third refractive index, and the second refractive index is greater than the third refractive index.

13. The display device of claim 12, further comprising:
an encapsulation layer, wherein at least a portion of the second insulating layer is between the encapsulation layer and the first insulating layer.

14. The display device of claim 1, wherein a number of the at least one LED device is at least two;
further comprising:
an optical isolation structure between the two LED devices.

15. The display device of claim 1, wherein the at least one LED device is plural;
further comprising:
at least two pixels, wherein each of the pixels comprises at least two of the LED devices; and
an optical isolation structure between the two pixels.

16. The display device of claim 1, wherein the at least one LED device is plural, the LED devices at least form a 2 by 2 matrix on the substrate, a size of each of the LED devices is less than about 200 micrometer, and an area of each of the LED devices is less than about 40000 square micrometers.

17. The display device of claim 1, wherein the LED device further comprises:
a current control layer joined with the p type semiconductor layer, the n type semiconductor layer, or combinations thereof, wherein the current control layer has an opening, and a vertical projection of the opening on a bottom surface of the p type semiconductor layer at least partially overlaps with the low resistance portion.

18. A display device, comprising:
a substrate;
at least one bonding electrode;
at least one light emitting diode (LED) device electrically connected to the bonding electrode, wherein the bonding electrode is between the LED device and the substrate, and the LED device comprises:
a p type semiconductor layer having a first surface facing towards the substrate and a second surface opposite to the first surface, the p type semiconductor layer comprising a low resistance portion and a high resistance portion, wherein the low resistance portion is enclosed by the high resistance portion, and a resistivity of the p type semiconductor layer increases from the low resistance portion toward the high resistance portion;
a n type semiconductor layer, wherein the p type semiconductor layer is between the n type semiconductor layer and the bonding electrode, the low resistance portion continuously extends from the first surface to the second surface, and the low resistance portion forms a part of the first surface and a part of the second surface; and
an intermediate layer between the p type semiconductor layer and the bonding electrode; and
a transparent conductive layer electrically connected to the n type semiconductor layer, wherein the LED device is between the transparent conductive layer and the bonding electrode.

19. A display device, comprising:
a substrate;
at least one bonding electrode;
at least one light emitting diode (LED) device electrically connected to the bonding electrode, wherein the bonding electrode is between the LED device and the substrate, and the LED device comprises:
a p type semiconductor layer having a first surface facing towards the substrate and a second surface opposite to the first surface, the p type semiconductor layer comprising a low resistance portion and a high resistance portion, wherein the low resistance portion is enclosed by the high resistance portion, and a resistivity of the p type semiconductor layer increases from the low resistance portion toward the high resistance portion;
a n type semiconductor layer, wherein the p type semiconductor layer is between the n type semiconductor layer and the bonding electrode, the low resistance portion continuously extends from the first surface to the second surface, and a current is allowed to flow from the at least one bonding electrode to the n type semiconductor layer crossing the first surface and the second surface and only through the low resistance portion; and
an intermediate layer between the p type semiconductor layer and the bonding electrode; and
a transparent conductive layer electrically connected to the n type semiconductor layer, wherein the LED device is between the transparent conductive layer and the bonding electrode.

* * * * *